US012633908B2

(12) United States Patent
Xu et al.

(10) Patent No.: US 12,633,908 B2
(45) Date of Patent: May 19, 2026

(54) COMPARATOR BASED ON PRE-AMPLIFIER STAGE STRUCTURE AND ANALOG-TO-DIGITAL CONVERTER

(71) Applicant: Chongqing GigaChip Technology Co., Ltd., Chongqing (CN)

(72) Inventors: Daiguo Xu, Chongqing (CN); Hequan Jiang, Chongqing (CN); Ruzhang Li, Chongqing (CN); Jianan Wang, Chongqing (CN); Dongbing Fu, Chongqing (CN); Guangbing Chen, Chongqing (CN); Zhou Yu, Chongqing (CN); Zhengping Zhang, Chongqing (CN); Can Zhu, Chongqing (CN); Weiqi Gao, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 107 days.

(21) Appl. No.: 18/634,981

(22) Filed: Apr. 14, 2024

(65) Prior Publication Data

US 2024/0275370 A1     Aug. 15, 2024

Related U.S. Application Data

(63) Continuation of application No. PCT/CN2021/143489, filed on Dec. 31, 2021.

(30) Foreign Application Priority Data

Dec. 22, 2021     (CN) .......................... 202111581695.3

(51) Int. Cl.
*H03K 5/24*          (2006.01)
*H03M 1/08*          (2006.01)

(52) U.S. Cl.
CPC ............ *H03K 5/2481* (2013.01); *H03M 1/08* (2013.01)

(58) Field of Classification Search
CPC ...... H03K 5/24; H03K 5/2472; H03K 5/2481; H03K 5/249; H03K 3/023; H03K 3/353; H03M 1/06; H03M 1/08; H03M 1/12
See application file for complete search history.

(56) References Cited

U.S. PATENT DOCUMENTS

2013/0057422 A1*   3/2013   Johansson ............ H03K 5/2481
                                                             327/57

FOREIGN PATENT DOCUMENTS

CN          107342752   A      11/2017
CN          110289838   A      9/2019
                              (Continued)

OTHER PUBLICATIONS

High-speed low-power and low-power supply voltage dynamic comparator, published on Nov. 5, 2015, Electronics Letters, vol. 51, No. 23, pp. 1914-1916.

*Primary Examiner* — Long Nguyen

(57)          ABSTRACT

A comparator based on a pre-amplifier stage structure and an analog-to-digital converter are provided. The comparator includes: a first pre-amplifier stage, where an input terminal of the first pre-amplifier stage is connected to a differential input signal, to amplify and output the differential input signal so as to output a first differential output signal; a second pre-amplifier stage, where an input terminal of the second pre-amplifier stage is connected to the first differential output signal, to amplify and output the first differential output signal so as to output a second differential output signal, and a positive feedback unit is disposed between an output terminal of the second pre-amplifier stage and the input terminal of the second pre-amplifier stage, to increase a voltage gain of the second pre-amplifier stage by using the (Continued)

positive feedback unit; and a latch, an input terminal thereof connected to the second differential output signal.

9 Claims, 9 Drawing Sheets

(56)  References Cited

FOREIGN PATENT DOCUMENTS

| CN | 110995213 A | 4/2020 |
| CN | 113067557 A | 7/2021 |

* cited by examiner

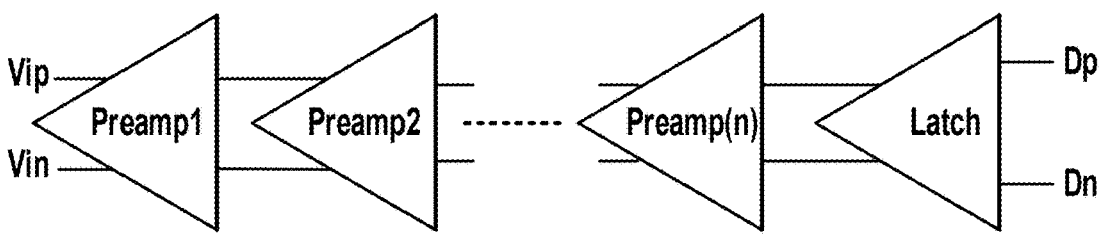
Prior Art FIG. 1
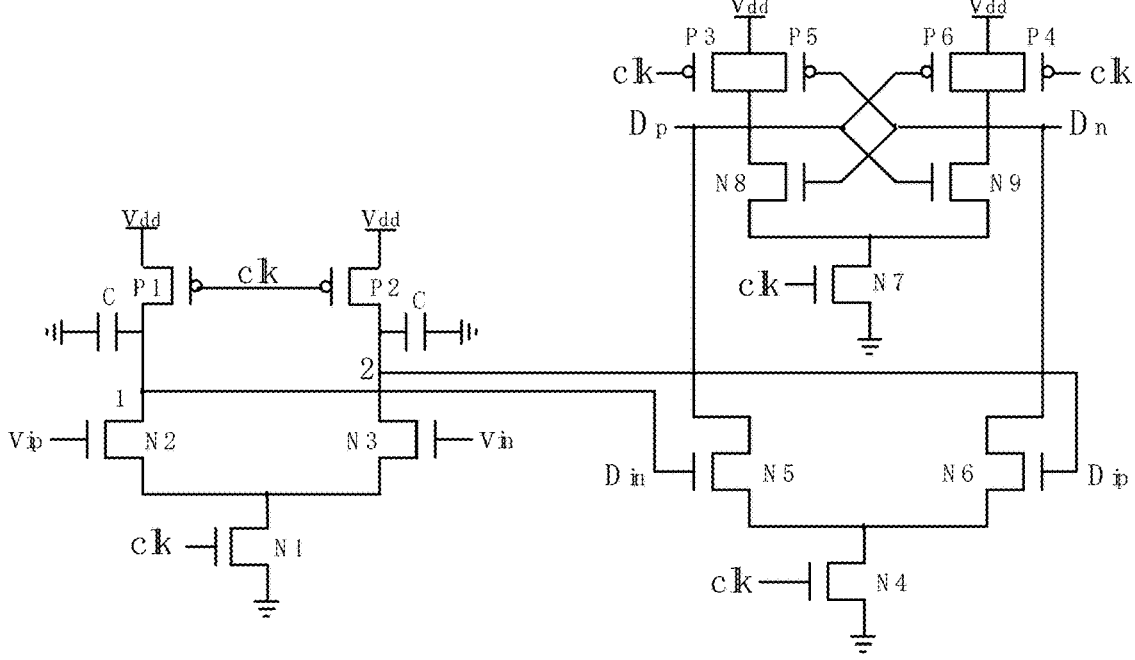
Prior Art FIG. 2
Prior Art FIG. 3 latch analog-to-digital converter comparator based on a
pre-amplifier stage
structure

COMPARATOR BASED ON PRE-AMPLIFIER STAGE STRUCTURE AND ANALOG-TO-DIGITAL CONVERTER

CROSS REFERENCE TO RELATED APPLICATION

The present application is a continuation application of PCT Application No. PCT/CN2021/143489, filed on Dec. 31, 2021, which claims the benefit of priority to a Chinese Patent Application number CN202111581695.3, filed on Dec. 22, 2021, the disclosure of the above application is hereby incorporated by reference in its entirety for all purposes.

TECHNICAL FIELD

The present disclosure relates to the field of integrated circuit technologies, and in particular, to a comparator based on a pre-amplifier stage structure and an analog-to-digital converter.

BACKGROUND

In recent years, with continuous development of integrated circuit manufacturing technologies, a feature size of a CMOS device continuously decreases, and a working voltage of an integrated circuit also continuously decreases. In a deep submicron process, a working speed of an analog-to-digital converter is greatly increased, and power consumption thereof is further reduced. However, as a core component of the analog-to-digital converter, performance of a comparator becomes a bottleneck in high-speed and low-power design. Several conventional comparator structures are difficult to meet requirements for a speed, power consumption, and a low supply voltage.

When a precision requirement is low, a single-stage latch structure may be used as a comparator structure. Advantages of the single-stage latch structure lie in a high speed and low power consumption, but disadvantages thereof lie in large noise and a large offset. When a precision requirement is high, to suppress disadvantages such as large noise and a large offset of the single-stage latch structure, the comparator is generally formed after a plurality of pre-amplifiers stages are cascaded and then connected to a latch stage. However, a disadvantage of using a structure formed after a plurality of pre-amplifiers stages are cascaded and then connected to a latch stage lies in that, in a reset process of the comparator, because a capacitor exists at an output terminal of the pre-amplifier stage, a reset speed of the comparator is significantly reduced, and power consumption of the comparator is increased.

SUMMARY

The present disclosure provides a comparator based on a pre-amplifier stage structure and an analog-to-digital converter, to resolve a problem of large noise of a comparator in the conventional technology.

The present disclosure provides a comparator based on a pre-amplifier stage structure, including:

a first pre-amplifier stage, where an input terminal of the first pre-amplifier stage is connected to a differential input signal, to amplify and output the differential input signal so as to output a first differential output signal;

a second pre-amplifier stage, where an input terminal of the second pre-amplifier stage is connected to the first differential output signal, to amplify and output the first differential output signal so as to output a second differential output signal, and a positive feedback unit is disposed between an output terminal of the second pre-amplifier stage and the input terminal of the second pre-amplifier stage, to increase a voltage gain of the second pre-amplifier stage by using the positive feedback unit; and a latch, where an input terminal of the latch is connected to the second differential output signal.

In exemplary embodiments, the comparator based on a pre-amplifier stage structure further includes one pre-amplifier stage, and the pre-amplifier stage is connected in series between the first pre-amplifier stage and the second pre-amplifier stage.

In exemplary embodiments, the comparator based on a pre-amplifier stage structure further includes N pre-amplifier stages, N is an integer greater than or equal to 2, and the N pre-amplifier stages are cascaded and then connected in series between the first pre-amplifier stage and the second pre-amplifier stage.

In exemplary embodiments, a structure of each of the N pre-amplifier stages is the same as a structure of the second pre-amplifier stage.

In exemplary embodiments, the first pre-amplifier stage includes:

a first NMOS transistor, a second NMOS transistor, a third NMOS transistor, a first PMOS transistor, and a second PMOS transistor, where a source of the first NMOS transistor is grounded, a gate of the first NMOS transistor is connected to a first control signal, and a drain of the first NMOS transistor is connected to a first node;

a source of the second NMOS transistor is connected to the first node, a gate of the second NMOS transistor is connected to the differential input signal, and a drain of the second NMOS transistor is connected to a second node;

a source of the third NMOS transistor is connected to the first node, a gate of the third NMOS transistor is connected to the differential input signal, and a drain of the third NMOS transistor is connected to a third node;

a drain of the first PMOS transistor is connected to the second node, a gate of the first PMOS transistor is connected to the first control signal, and a source of the first PMOS transistor is connected to a working voltage;

a drain of the second PMOS transistor is connected to the third node, a gate of the second PMOS transistor is connected to the first control signal, and a source of the second PMOS transistor is connected to the working voltage; and the first differential output signal is output by using the second node and the third node.

In exemplary embodiments, the second pre-amplifier stage includes a pre-amplifier stage main unit and the positive feedback unit, and the positive feedback unit includes:

a fourth NMOS transistor, a fifth NMOS transistor, a sixth NMOS transistor, and a seventh NMOS transistor, wherein a gate of the fourth NMOS transistor is connected to a fourth node, a source of the fourth NMOS transistor is connected to a fifth node, and a drain of the fourth NMOS transistor is connected to a gate of the seventh NMOS transistor;

a source of the fifth NMOS transistor is connected to the fifth node, a gate of the fifth NMOS transistor is connected to a sixth node, and a drain of the fifth NMOS transistor is connected to a gate of the sixth NMOS transistor;

a source of the sixth NMOS transistor is connected to the sixth node, and a drain of the sixth NMOS transistor is connected to a seventh node; and a source of the seventh NMOS transistor is connected to the fourth node, and a drain of the seventh NMOS transistor is connected to an eighth node.

In exemplary embodiments, the pre-amplifier stage main unit includes:

an eighth NMOS transistor, a third PMOS transistor, a fourth PMOS transistor, a fifth PMOS transistor, and a sixth PMOS transistor, wherein a source of the eighth NMOS transistor is grounded, and a drain of the eighth NMOS transistor is connected to the fifth node;

a second control signal is separately connected to a gate of the eighth NMOS transistor, a gate of the third PMOS transistor, a gate of the fourth PMOS transistor, a gate of the fifth PMOS transistor, and a gate of the sixth PMOS transistor, and a working voltage is separately connected to a source of the third PMOS transistor, a source of the fourth PMOS transistor, a source of the fifth PMOS transistor, and a source of the sixth PMOS transistor;

a drain of the third PMOS transistor is connected to the eighth node, a drain of the fourth PMOS transistor is connected to the seventh node, a drain of the fifth PMOS transistor is connected to the drain of the fourth NMOS transistor, and a drain of the sixth PMOS transistor is connected to the drain of the fifth NMOS transistor; and the first differential output signal is separately connected to the fourth node and the sixth node, and the second differential output signal is output by using the seventh node and the eighth node.

In exemplary embodiments, the latch includes a sampling unit and a holding unit;

an input terminal of the sampling unit is separately connected to the seventh node and the eighth node, and the sampling unit samples the second differential output signal; and an output terminal of the sampling unit is connected to the holding unit, and the holding unit holds the second differential output signal.

In exemplary embodiments, the first control signal and the second control signal are a same control signal.

The present disclosure provides an analog-to-digital converter, where the analog-to-digital converter includes the foregoing comparator based on a pre-amplifier stage structure.

Beneficial effects of the exemplary embodiments of the present disclosure are as follows: the comparator based on a pre-amplifier state structure in the present disclosure includes the first pre-amplifier stage and the second pre-amplifier stage, and the positive feedback unit is disposed between the input terminal and the output terminal of the second pre-amplifier stage. The voltage gain of the second pre-amplifier stage is increased by using the positive feedback unit, especially a small-signal voltage gain, so that equivalent input noise of the comparator can be effectively reduced.

BRIEF DESCRIPTION OF DRAWINGS

FIG. 1 is a schematic diagram of a comparator in which a plurality of stages is cascaded;

FIG. 2 is a circuit diagram of a comparator in prior art in which one pre-amplifier stage and one latch stage are cascaded;

FIG. 3 is a circuit diagram of a high-precision comparator in prior art in which one pre-amplifier stage and one latch stage are cascaded;

DESCRIPTION OF EMBODIMENTS

Figure 4:
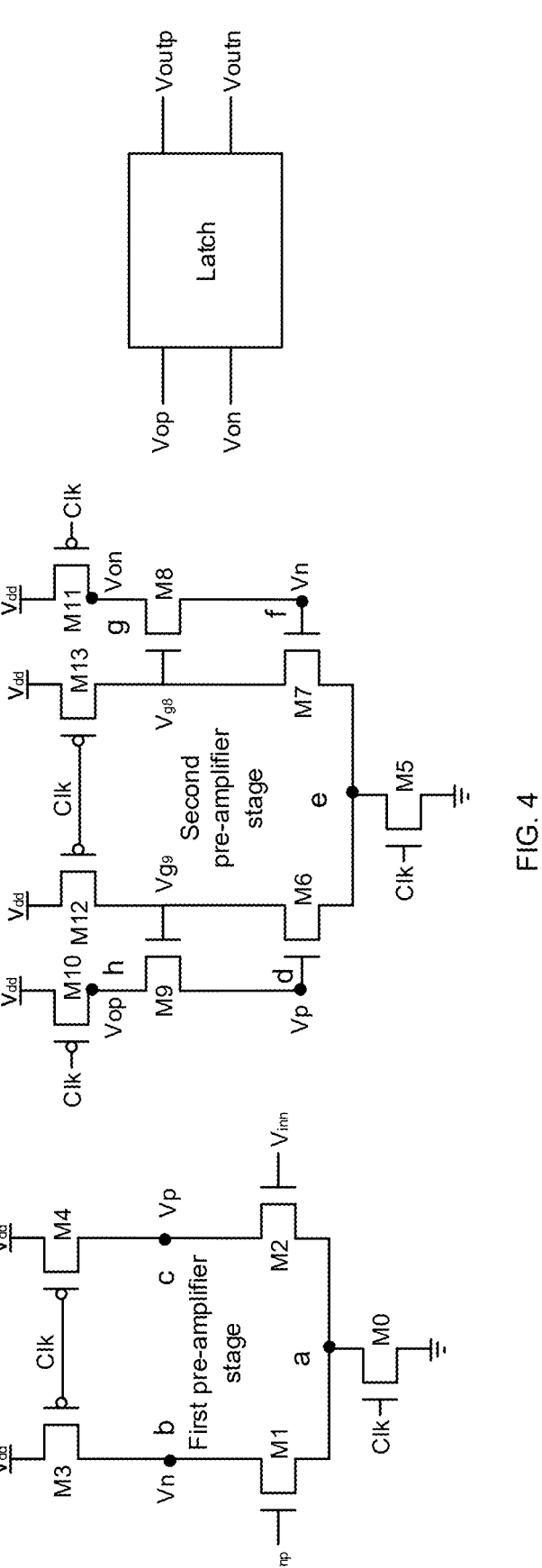
FIGS. 4 and 4A to 4D each shows a comparator based on a pre-amplifier stage structure according to an embodiment of the present disclosure.

As mentioned in the Background, when a precision requirement is high, to suppress disadvantages such as large noise and a large offset of a single-stage latch structure, a comparator is generally formed after a plurality of pre-amplifiers stages are cascaded and then connected to a latch stage. A high gain is provided by using the pre-amplifier stage to suppress equivalent input noise of the comparator. A slow change of a signal output by using the pre-amplifier stage is used to suppress the offset of the comparator. As shown in FIG. 1, a first input signal Vip and a second input signal Vin are amplified by a plurality of pre-amplifier stages (Preamp-1, Preamp-2, . . . , Preamp-n) and then input into a latch, so that large noise and a large offset of the latch do not affect comparison precision of the comparator.

To describe the above problems in more detail, working principles, advantages, and disadvantages of two conventional-structure comparators in prior art are analyzed by using cascading between one pre-amplifier stage and one latch stage as an example.

FIG. 2 is a circuit diagram of a comparator in prior art in which one pre-amplifier stage and one latch stage are cascaded. As shown in FIG. 2, an NMOS transistor N1, an NMOS transistor N2, an NMOS transistor N3, a PMOS transistor P1, and a PMOS transistor P2 constitute a pre-amplifier stage. The NMOS transistor N1 is a tail current transistor, the NMOS transistor N2 and the NMOS transistor N3 are input transistors, and the PMOS transistor P1 and the PMOS transistor P2 are load transistors. An NMOS transistor N4, an NMOS transistor N5, an NMOS transistor N6, an NMOS transistor N7, an NMOS transistor N8, an NMOS transistor N9, a PMOS transistor P3, a PMOS transistor P4, a PMOS transistor P5, and a PMOS transistor P6 constitute a latch. When the comparator is in a reset state, a control signal clk is 0 (low level), so that the NMOS transistor N1, the NMOS transistor N4, and the NMOS transistor N7 are turned off, and the entire comparator has no static power consumption. When the comparator is in a comparison state, a control signal clk is 1 (high level), and a direct current gain A of the pre-amplifier stage may be represented as follows:

$$A = gm \cdot (roN2, N3 \| roP1, P2) \qquad (1)$$

where gm represents transconductance of the NMOS transistor N2 and the NMOS transistor N3, $r_{oN2,N3}$ represents small-signal equivalent output impedance of the NMOS transistor N2 and the NMOS transistor N3, and $r_{oP1,P2}$ represents small-signal equivalent output impedance of the PMOS transistor P1 and the PMOS transistor P2.

In this case, a main pole p of the pre-amplifier stage may be represented as follows:

$$p = 1/((roN2, N3 \| roP1, P2)Cp) \qquad (2)$$

where Cp represents load capacitance at an output terminal of the pre-amplifier stage.

Advantages of the comparator lie in a high speed and low power consumption, but disadvantages thereof lie in large noise and a large offset. It may be learned from a formula for calculating equivalent input noise of the pre-amplifier stage that, if the direct current gain A of the pre-amplifier stage is increased or a bandwidth of the pre-amplifier stage is reduced, the equivalent input noise of the pre-amplifier stage can be reduced. It may be learned from Formula (1) that, after the design of the pre-amplifier stage is completed, the transconductance gm of the input transistors, the small-signal equivalent output impedance roN2,N3 of the input transistors, the small-signal equivalent output impedance roP1,P2 of the load transistors are fixed, and it is difficult to increase the direct current gain A of the pre-amplifier stage. In addition, because the bandwidth of the pre-amplifier stage is related to the main pole p, if the main pole p is reduced, the bandwidth may be correspondingly reduced. Therefore, if the equivalent input noise of the pre-amplifier stage needs to be reduced, the main pole p of the pre-amplifier stage may be reduced. It may be learned from Formula (2) that the load capacitance Cp of the pre-amplifier stage needs to be increased.

Based on the foregoing analysis, a high-precision comparator in prior art is proposed. As shown in FIG. 3, based on the structure of the comparator, shown in FIG. 2, in which one pre-amplifier stage and one latch stage are cascaded, a capacitor C is added at the output terminal (a node 1 and a node 2) of the pre-amplifier stage, so that the load capacitance Cp of the pre-amplifier stage is increased, and the bandwidth of the pre-amplifier stage is reduced, to well suppress the equivalent input noise of the pre-amplifier stage. However, after an output voltage of the pre-amplifier stage is amplified, the noise is no longer a major factor that limits performance of the comparator. In addition, in a reset process of the comparator, because the capacitors C exist at the output terminal of the pre-amplifier stage, a reset speed of the comparator is significantly reduced, and power consumption of the comparator is increased.

Therefore, the inventor proposes a new concept that: a comparator based on a pre-amplifier state structure includes a first pre-amplifier stage and a second pre-amplifier stage, and a positive feedback unit is disposed between an input terminal and an output terminal of the second pre-amplifier stage. A voltage gain of the second pre-amplifier stage is increased by using the positive feedback unit, especially a small-signal voltage gain, so that equivalent input noise of the comparator is reduced.

In an embodiment, the present disclosure provides a comparator based on a pre-amplifier stage structure. The comparator includes: a first pre-amplifier stage, where an input terminal of the first pre-amplifier stage is connected to a differential input signal, to amplify and output the differential input signal so as to output a first differential output signal; a second pre-amplifier stage, where an input terminal of the second pre-amplifier stage is connected to the first differential output signal, to amplify and output the first differential output signal to output a second differential output signal, and a positive feedback unit is disposed between an output terminal of the second pre-amplifier stage and the input terminal of the second pre-amplifier stage, to increase a voltage gain of the second pre-amplifier stage by using the positive feedback unit; and a latch, where an input terminal of the latch is connected to the second differential output signal.

In exemplary embodiments, the comparator based on a pre-amplifier stage structure further includes another pre-amplifier stage, and the another pre-amplifier stage is connected in series between the first pre-amplifier stage and the second pre-amplifier stage. In exemplary embodiments, a structure of the another pre-amplifier stage is the same as a structure of the second pre-amplifier stage, as shown in FIG. 4B. In exemplary embodiments, a structure of the another pre-amplifier stage is the same as a structure of the first pre-amplifier stage, as shown in FIG. 4A.

Figure 4A:
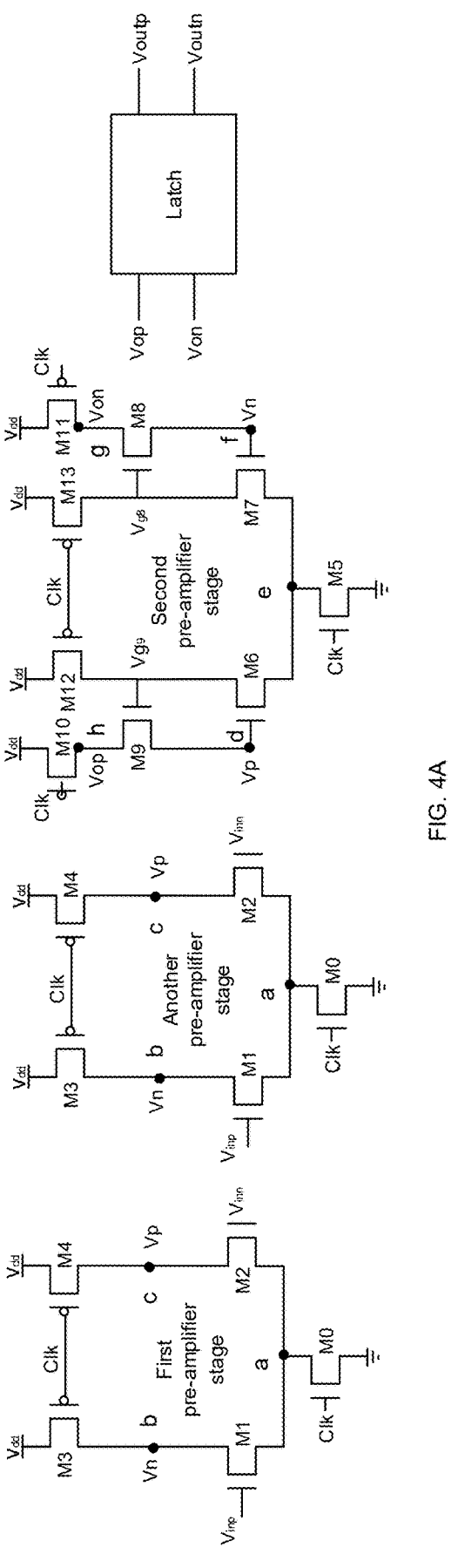
Figure 4B:
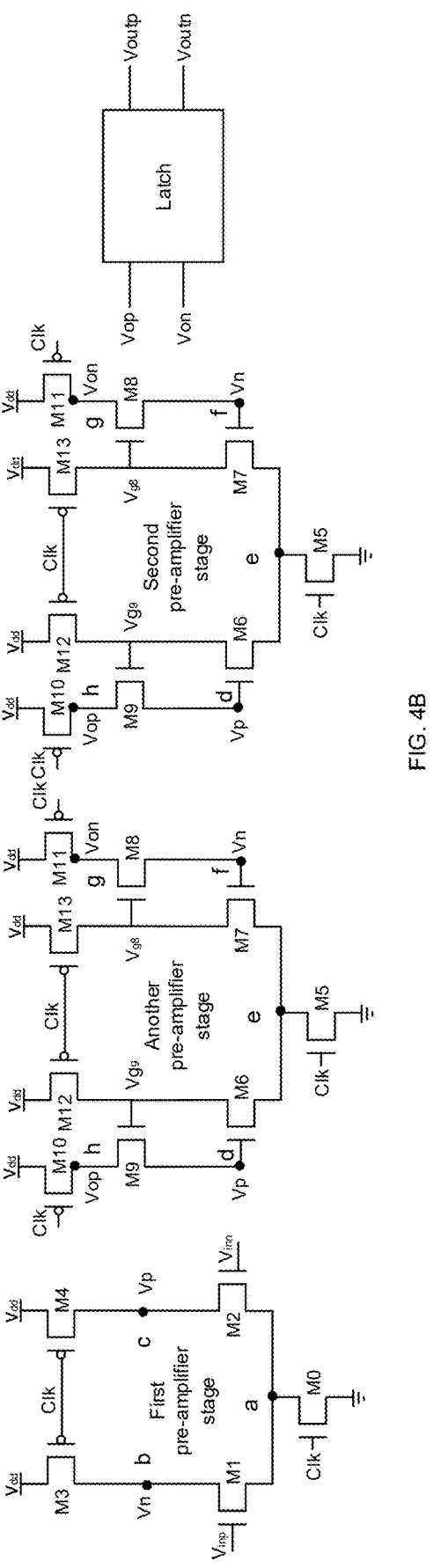
Figure 4C:
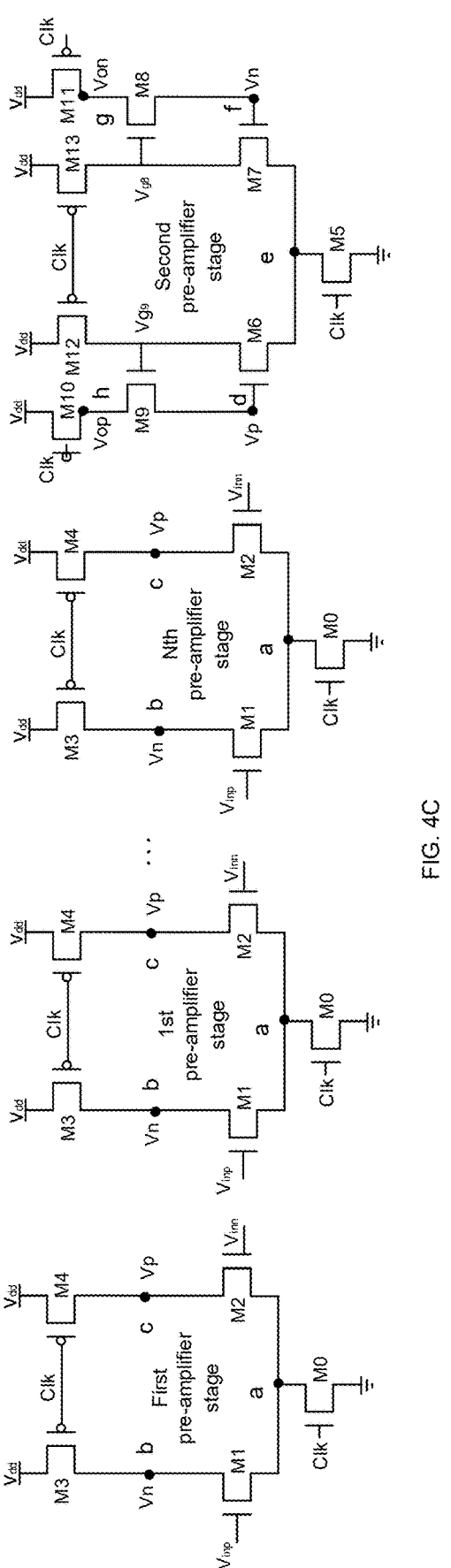
Figure 4D:
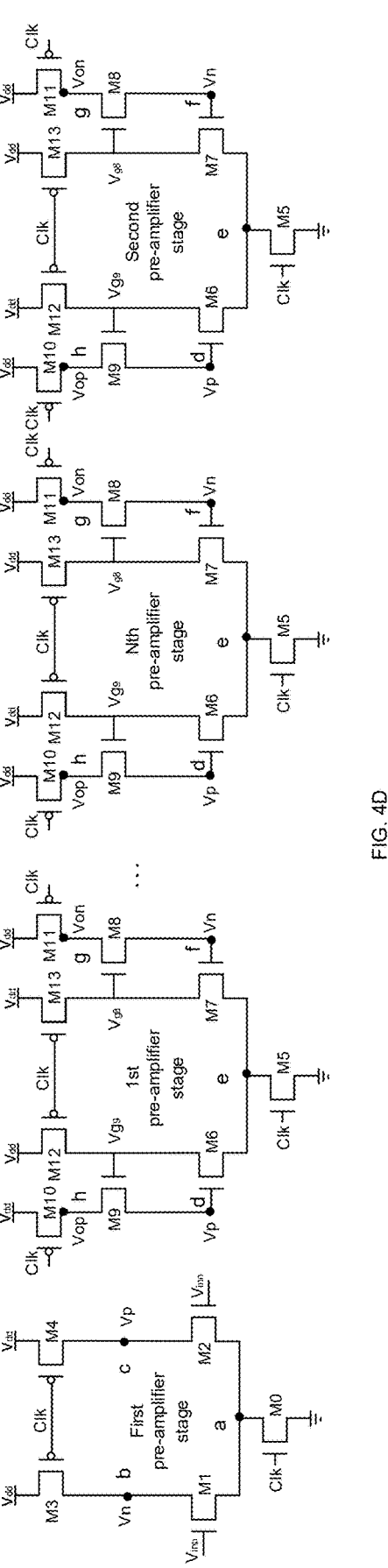
Figure 4E:
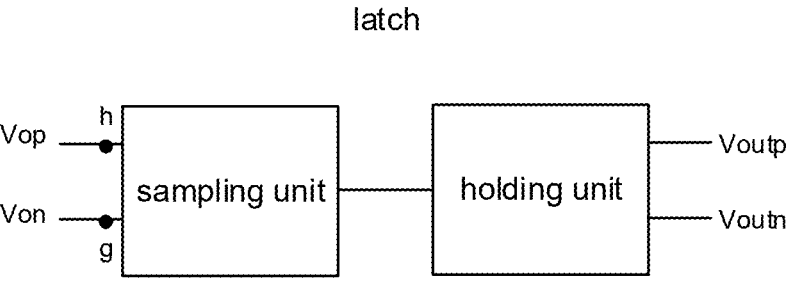
FIG. 4E shows a diagram of a latch in FIGS. 4 to 4D.

In exemplary embodiments, as shown in FIGS. 4C and 4D, the comparator based on a pre-amplifier stage structure further includes N pre-amplifier stages, N is an integer greater than or equal to 2, and the N pre-amplifier stages are cascaded and then connected in series between the first pre-amplifier stage and the second pre-amplifier stage. In exemplary embodiments, a structure of each of the N pre-amplifier stages is the same as a structure of the second pre-amplifier stage, as shown in FIG. 4D. In exemplary embodiments, a structure of each of the N pre-amplifier stages is the same as a structure of the first pre-amplifier stage, as shown in FIG. 4C.

In addition, the present disclosure further provides an analog-to-digital converter. The analog-to-digital converter includes the comparator based on a pre-amplifier stage structure, so that working efficiency of the analog-to-digital converter is improved through fast and precise comparison of the comparator based on the pre-amplifier stage structure.

The following describes some implementations of the present disclosure by using some specific examples. A person skilled in the art can easily understand other advantages and effects of the present disclosure based on the content disclosed in this specification. The present disclosure may be further implemented or applied in some other different specific implementations. Various details in this specification may also be modified or altered based on different viewpoints and applications without departing from the present disclosure. It should be noted that the following embodiments and features in the embodiments may be mutually combined when there are no conflicts.

Refer to FIG. 4 to FIG. 8. It should be noted that, the illustrations provided in some embodiments merely describe the basic concept of the present disclosure by using examples. Although the drawings show only components related to the present disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the accompanying drawings of this specification are merely used to cooperate with the content disclosed in the specification for understanding and reading by a person skilled in the art, and are not restrictions for limiting implementation of the present disclosure, and therefore have no technically substantial significance. Any modification of the structure, change of a proportional relationship or adjustment of the size shall still fall within the scope that can be covered by the technical content disclosed in the present disclosure, provided that they do not affect the effects that can be generated by the present disclosure and the purpose that can be achieved by the present disclosure.

For a thorough understanding of the present disclosure, detailed steps and detailed structures are proposed in the following descriptions to describe the technical solutions proposed in the present disclosure. A preferred embodiment of the present disclosure is described in detail as follows. However, in addition to these detailed descriptions, the present disclosure may have another implementation.

Referring to FIG. 4, the first pre-amplifier stage includes a first NMOS transistor M0, a second NMOS transistor M1, a third NMOS transistor M2, a first PMOS transistor M3, and a second PMOS transistor M4. A source of the first NMOS transistor M0 is grounded, a gate of the first NMOS transistor M0 is connected to a first control signal Clk, and a drain of the first NMOS transistor M0 is connected to a first node a. A source of the second NMOS transistor M1 is connected to the first node a, a gate of the second NMOS transistor M1 is connected to a positive terminal Vinp of a differential input signal, and a drain of the second NMOS transistor M1 is connected to a second node b. A source of the third NMOS transistor M2 is connected to the first node a, a gate of the third NMOS transistor M2 is connected to a negative terminal Vinn of the differential input signal, and a drain of the third NMOS transistor M2 is connected to a third node c. A drain of the first PMOS transistor M3 is connected to the second node b, a gate of the first PMOS transistor M3 is connected to the first control signal Clk, and a source of the first PMOS transistor M3 is connected to a working voltage Vdd. A drain of the second PMOS transistor M4 is connected to the third node c, a gate of the second PMOS transistor M4 is connected to the first control signal Clk, and a source of the second PMOS transistor M4 is connected to the working voltage Vdd. The first differential output signal is output by using the second node b and the third node c, the second node b is used as an output negative terminal of the first differential output signal, and the third node c is used as an output positive terminal of the first differential output signal.

The second pre-amplifier stage includes a pre-amplifier stage main unit and the positive feedback unit, and the positive feedback unit includes a fourth NMOS transistor M6, a fifth NMOS transistor M7, a sixth NMOS transistor M8, and a seventh NMOS transistor M9. A gate of the fourth NMOS transistor M6 is connected to a fourth node d, a source of the fourth NMOS transistor M6 is connected to a fifth node e, and a drain of the fourth NMOS transistor M6 is connected to a gate of the seventh NMOS transistor M9. A source of the fifth NMOS transistor M7 is connected to the fifth node e, a gate of the fifth NMOS transistor M7 is connected to a sixth node f, and a drain of the fifth NMOS transistor M7 is connected to a gate of the sixth NMOS transistor M8. A source of the sixth NMOS transistor M8 is connected to the sixth node f, and a drain of the sixth NMOS transistor is connected to a seventh node g. A source of the seventh NMOS transistor M9 is connected to the fourth node d, and a drain of the seventh NMOS transistor M9 is connected to an eighth node h. The pre-amplifier stage main unit includes an eighth NMOS transistor M5, a third PMOS transistor M10, a fourth PMOS transistor M11, a fifth PMOS transistor M12, and a sixth PMOS transistor M13. A source of the eighth NMOS transistor M5 is grounded, and a drain of the eighth NMOS transistor M5 is connected to the fifth node e. A second control signal Clk is separately connected to a gate of the eighth NMOS transistor M5, a gate of the third PMOS transistor M10, a gate of the fourth PMOS transistor M11, a gate of the fifth PMOS transistor M12, and a gate of the sixth PMOS transistor M13. A working voltage Vdd is separately connected to a source of the third PMOS transistor M10, a source of the fourth PMOS transistor M11, a source of the fifth PMOS transistor M12, and a source of the sixth PMOS transistor M13. A drain of the third PMOS transistor M10 is connected to the eighth node h, a drain of the fourth PMOS transistor M11 is connected to the seventh node g, a drain of the fifth PMOS transistor M12 is connected to the drain of the fourth NMOS transistor M6, and a drain of the sixth PMOS transistor M13 is connected to the drain of the fifth NMOS transistor. The first differential output signal is separately connected to the fourth node d and the sixth node f, a negative terminal Vn of the first differential output signal is connected to the sixth node f, and a positive terminal Vp of the first differential output signal is connected to the fourth node d. The second differential output signal is output by using the seventh node g and the eighth node h, a positive terminal Vop of the second differential output signal is connected to the eighth node h, and a negative terminal Von of the second differential output signal is connected to the seventh node g. The positive terminal Vop and the negative terminal Von of the second differential output signal are connected to an input terminal of the latch, and the latch outputs third differential output signals Voutp and Voutn. Output terminals Voutp and Voutn of the latch structure are an output terminal of the entire comparator.

In exemplary embodiments, the first control signal and the second control signal are a same control signal. In exemplary embodiments, the latch includes a sampling unit and a holding unit. An input terminal of the sampling unit is separately connected to the seventh node and the eighth node, and the sampling unit samples the second differential output signal. An output terminal of the sampling unit is connected to the holding unit, and the holding unit holds the second differential output signal.

Figure 5:
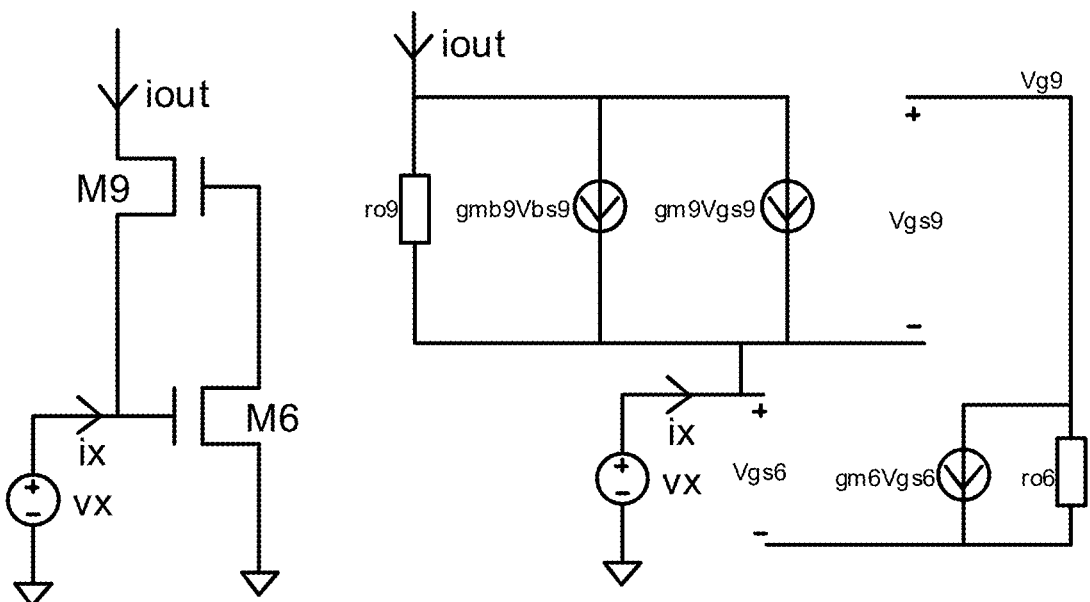
FIG. 5 is a circuit diagram of input impedance of a second pre-amplifier stage and an equivalent circuit diagram of a small signal thereof according to an embodiment of the present disclosure.
Figures 6, 7:
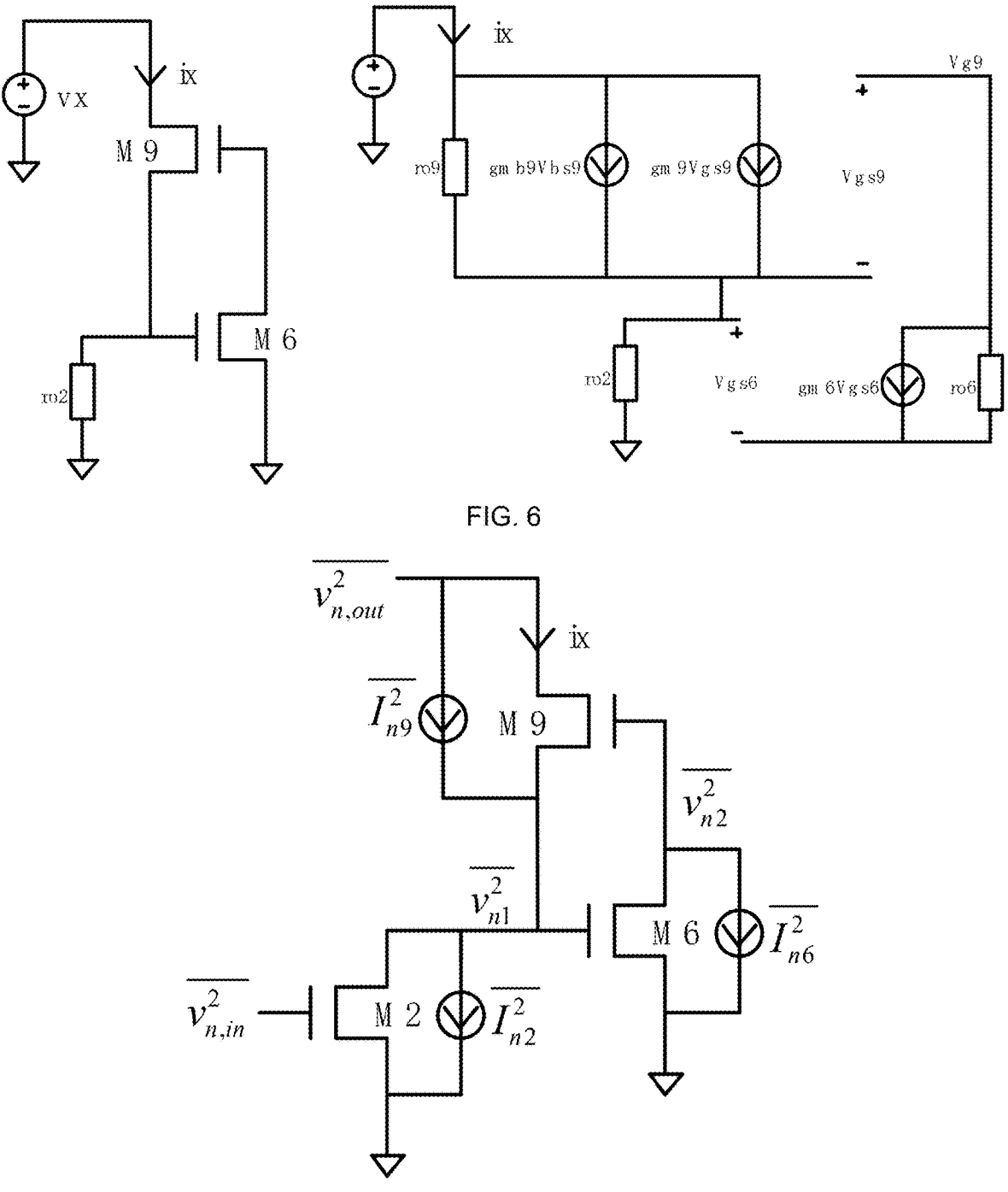
FIG. 6 is a circuit diagram of output impedance of a second pre-amplifier stage and an equivalent circuit diagram of a small signal thereof according to an embodiment of the present disclosure.
FIG. 7 is an equivalent circuit diagram of noise of a half circuit of a first pre-amplifier stage and a second pre-amplifier stage according to an embodiment of the present disclosure.

Referring to FIG. 5, FIG. 6, and FIG. 7, first, input impedance of the second pre-amplifier stage is calculated, and a circuit diagram of an input impedance of the second pre-amplifier stage and an equivalent circuit diagram of a small signal thereof are shown in FIG. 5. It may be learned from the Kirchhoff's current laws of the gate of the seventh NMOS transistor M9 that:

$$i_x = g_{m9} v_{gs9} v_x - \frac{v_x}{r_{o9}} = 0 \tag{3}$$

where $i_x$ is an input current of a current stage, $g_{m9}$ is gate transconductance of M9, $g_{mb9}$ is substrate transconductance of M9, $V_{gs9}$ is a gate-source voltage of M9, $v_x$ is an input voltage, and rog is small-signal output impedance of M9; and $$i_x - g_{m9}(g_{m6}r_{o6} + 1)v_x - g_{mb9}v_x - \frac{v_x}{r_{o9}} = 0 \qquad (4)$$

where $g_{m6}$ is gate transconductance of M6, and $r_{o6}$ is small-signal output impedance of M6.

Therefore, the input impedance of the second pre-amplifier stage may be represented as the small-signal output impedance of M6:

$$R_{in,2} = \frac{v_x}{i_x} = \frac{1}{g_{m9}g_{m6}r_{o6} + g_{m9} + g_{mb9} + \frac{1}{r_{o9}}} \qquad (5)$$

where $R_{in,2}$ is the input impedance of the second pre-amplifier stage.

A gain of the first pre-amplifier stage may be represented as follows:

$$A_{v1} = \qquad (6)$$

$$-g_{m2}(r_{o9} \| R_{in,2}) \approx -g_{m2}R_{in,2} = A_{v1} = \frac{-g_{m2}}{g_{m9}g_{m6}r_{o6} + g_{m9} + g_{mb9} + \frac{1}{r_{o9}}}$$

where $A_{v1}$ is the gain of the first pre-amplifier stage, and $g_{m2}$ is gate transconductance of M2.

Therefore, to calculate a small-signal voltage gain of the second pre-amplifier stage, transconductance $G_{m,1}$ and output impedance of the second pre-amplifier stage need to be calculated. It may be learned from the Kirchhoff's current laws of the drain of M9 that:

$$i_{out} = g_{m9}v_{gs9} + g_{mb9}v_{bs9} - \frac{v_x}{r_{o9}} \qquad (7)$$

where $i_{out}$ is an output current of a current stage, $v_{gs9}$ is a gate-source voltage of M9, and $v_{bs9}$ is a substrate-source voltage of M9;

$$i_{out} = -g_{m9}(g_{m6}r_{o6} + 1)v_x - g_{mb9}v_x - \frac{v_x}{r_{o9}}; \text{ and} \qquad (8)$$

$$G_{m,2} = -\left(g_{m9}g_{m6}r_{o6} + g_{m9} + g_{mb9} + \frac{1}{r_{o9}}\right) \qquad (9)$$

where $G_{m,2}$ is transconductance of a second stage.

It may be learned from Formula (9) that the transconductance of the second pre-amplifier stage is very large. Through comparison between Formula (5) and Formula (9), the input impedance and the transconductance of the second pre-amplifier stage are in a reciprocal relationship, which may be represented as follows:

$$R_{in,2} = \frac{1}{G_{m,2}} \qquad (10)$$

Next, total transconductance of the first pre-amplifier stage and the second pre-amplifier stage needs to be calculated. It may be learned from FIG. 5 that:

$$v_x = g_{m2}(r_{o2}\|R_{in,2})\frac{v_{id}}{2} \approx g_{m2}R_{in,2}\frac{v_{id}}{2} \qquad (11)$$

where $v_{id}$ is an input voltage of a current stage;

$$G_{m,total} = \frac{i_{out}}{v_x} \times \frac{v_x}{v_{id}} = G_{m,2} \times \frac{v_x}{v_{id}} \qquad (12)$$

where $G_{m,total}$ is the total transconductance of the first pre-amplifier stage and the second pre-amplifier stage; and $$G_{m,total} = -\frac{1}{2}g_{m2}R_{in,2}\left(g_{m9}g_{m6}r_{o6} + g_{m9} + g_{mb9} + \frac{1}{r_{o9}}\right) \qquad (13)$$

It may be learned from Formula (10) and Formula (13) that the total transconductance may be represented as follows:

$$G_{m,total} = \frac{i_{out,dif}}{v_{id}} = -g_{m2} \qquad (14)$$

where $i_{out,dif}$ is a small-signal differential output current of a current stage.

To calculate equivalent output impedance of the second pre-amplifier stage, an equivalent circuit diagram of a small signal thereof is shown in FIG. 6. It may be learned from the Kirchhoff's laws of the drain of M9 that:

$$i_x = \frac{v_x - v_{gs6}}{r_{o9}} + g_{mb9}v_{bs9} + g_{m9}v_{gs9} \qquad (15)$$

where $v_{gs6}$ is a gate-source voltage of M6; and $$i_x = \frac{v_x - r_{o2}i_x}{r_{o9}} + g_{mb9}r_{o2}i_x - g_{m9}(g_{m6}r_{o6} + 1)r_{o2}i_x \qquad (16)$$

Therefore, the equivalent output impedance of the second pre-amplifier stage may be represented as follows:

$$R_{out,2} = g_{m9}r_{o9}g_{m6}r_{o6}r_{o2} + (g_{m9} + g_{mb9})r_{o9}r_{o2} + r_{o9} + r_{o2} \qquad (17)$$

where $R_{out,2}$ is the equivalent output impedance of the second pre-amplifier stage.

Therefore, the gain of the second pre-amplifier stage may be represented as follows:

$$A_{v2} = \qquad (18)$$

$$-G_{m,2}R_{out,2} = \left(g_{m9}g_{m6}r_{o6} + g_{m9} + g_{mb9} + \frac{1}{r_{o9}}\right) \times g_{m9}r_{o9}g_{m6}r_{o6}r_{o2} +$$

$$(g_{m9} + g_{mb9})r_{o9}r_{o2} + r_{o9} + r_{o2}$$

11 where $A_{v2}$ is the gain of the second pre-amplifier stage.

It may be learned that a total gain of the first pre-amplifier stage and the second pre-amplifier stage may be represented as follows:

$$A_{v,total} =$$ $$A_{v1} \times A_{v2} = -g_{m2}r_{o2}\left(g_{m9}r_{o9}g_{m6}r_{o6} + (g_{m9} + g_{mb9})r_{o9} + \frac{r_{o9}}{r_{o2}} + 1\right) \quad (19)$$

where $A_{v2}$ total is the total gain of the first pre-amplifier stage and the second pre-amplifier stage.

It may be learned from Formula (19) that the first two pre-amplifier stage structures proposed in the present disclosure can provide a large small-signal voltage gain. Therefore, the pre-amplifier stage structure can provide very high precision.

The following analyzes noise performance of the structure. A half circuit is used for calculation. An equivalent circuit diagram of noise of the half circuit of the first pre-amplifier stage and the second pre-amplifier stage is shown in FIG. 7.

$$v_{n1} = (I_{n2} + I_{n9})(r_{o2}\|R_{in,2}) \approx (I_{n2} + I_{n9})R_{in,2} \quad (20)$$

where $v_{n1}$ is an output noise voltage of M2, $I_{n2}$ is an output noise current of M2, Ing is an output noise current of M9, $r_{o2}$ is small-signal output impedance of M2, and $R_{in,2}$ is equivalent impedance of the gate of M6; and $$v_{n2} = I_{n6}r_{o6} + v_{n1}g_{m6}r_{o6} = I_{n6}r_{o6} + (I_{n2} + I_{n9})R_{in,2}g_{m6}r_{o6} \quad (21)$$

where $v_{n2}$ is an output noise voltage of a current stage, $I_{n6}$ is an output noise current of the current stage, $r_{o6}$ is small-signal output impedance of M6, $g_{m6}$ is gate transconductance of M6, and $R_{in,2}$ is equivalent impedance of the gate of M6.

Therefore, the following may be obtained:

$$v_{n,out} =$$ $$I_{n9}r_{o9} + g_{m9}r_{o9}I_{n6}r_{o6} + r_{o9}(I_{n2} + I_{n9})R_{in,2}(g_{m9} + g_{mb9} + g_{m9}g_{m6}r_{o6}) \quad (22)$$

where $\sqrt{v_{n,out}}$ is an output noise voltage of a current stage, $g_{m9}$ is gate transconductance of M9, $r_{o9}$ is small-signal output resistance of M9, and $g_{mb9}$ is substrate transconductance of M9.

The following can be obtained by substituting Formula (5) into Formula (22):

$$\overline{v_{n,out}^2} = 4kT\gamma r_{o9}^2\left(2g_{m9} + g_{m2} + g_{m9}^2 r_{o6}^2 g_{m6}\right) \quad (23)$$

where $$\overline{v_{n,out}^2}$$

12 is equivalent output noise of the first two pre-amplifier stages, k is the Boltzmann constant, T is temperature, and $\gamma$ is a constant.

Therefore, the equivalent input noise of the first two pre-amplifier stages may be represented as follows:

$$\overline{v_{n,in}^2} = \frac{\overline{v_{n,out}^2}}{A_{v,total}^2} = \frac{4kT\gamma r_{o9}^2\left(2g_{m9} + g_{m2} + g_{m9}^2 r_{o6}^2 g_{m6}\right)}{g_{m2}^2 r_{o2}^2\left(g_{m9}r_{o9}g_{m6}r_{o6} + (g_{m9} + g_{mb9})r_{o9} + \frac{r_{o9}}{r_{o2}} + 1\right)^2} \quad (24)$$

where $$\overline{v_{n,in}^2}$$

is the equivalent input noise of the first two pre-amplifier stages.

It may be learned from Formula (24) that, due to existence of a very large small-signal voltage gain, the equivalent input noise of the pre-amplifier stage structure is significantly reduced.

Figures 8, 9:
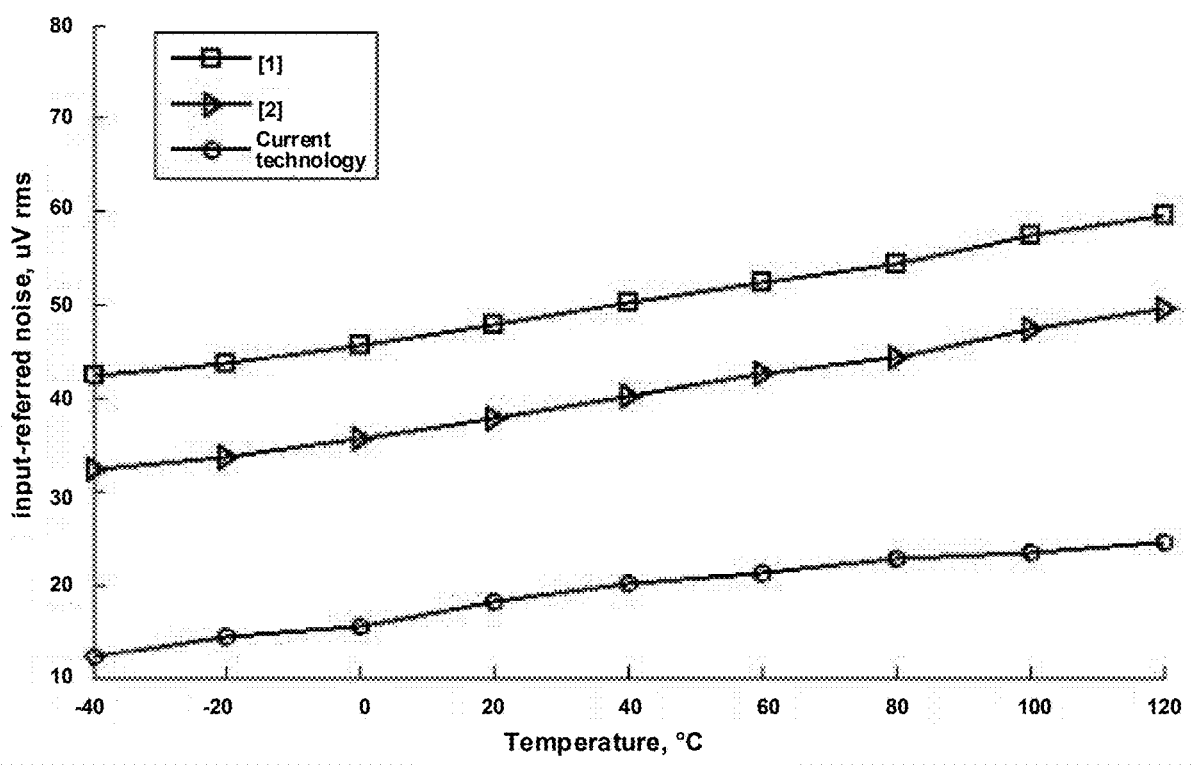
FIG. 8 is a diagram of comparison between equivalent input noise, of three comparators, that varies with temperature according to an embodiment of the present disclosure.
FIG. 9 is a diagram of an analog-to-digital converter according to an embodiment of the present disclosure.

Referring to FIG. 8, in a specific embodiment, in a 180 nm CMOS process, the foregoing structures in FIG. 2, FIG. 3, and FIG. 4 are carefully designed. For the foregoing three structures, a same input/output transistor size is used, a same size is also used for a latch structure, and load capacitance is 10 fF. A clock frequency is 40 MHz, and a supply voltage is 1.8 V. When |Dp–Dn|=0.9 V, it is considered that the comparator completes comparison. Through transient noise simulation, a diagram of comparison between equivalent input noise, of the comparators with the foregoing three structures, that varies with temperature is shown in FIG. 8. It may be learned from the foregoing simulation results that, compared with several conventional structures, according to the low-noise comparator based on a load adjustment technology provided in the present disclosure, the equivalent input noise is reduced by at least 60%. The simulation results indicate that the current technology improves precision of the high-speed comparator. In FIG. 8, [1] is the structure in FIG. 2, [2] is the structure in FIG. 3, and the current technology is of the structure in FIG. 4.

It may be learned that, according to the foregoing comparator based on a pre-amplifier stage structure, the positive feedback unit is introduced based on the pre-amplifier stage. The voltage gain of the second pre-amplifier stage is increased by using the positive feedback unit, especially a small-signal voltage gain, so that equivalent input noise of the comparator can be effectively reduced.

The present disclosure further provides an analog-to-digital converter, where the analog-to-digital converter includes the foregoing comparator based on a pre-amplifier stage structure.

The present disclosure further provides an electronic device, and the electronic device includes the foregoing analog-to-digital converter.

In conclusion, according to the comparator based on a pre-amplifier state structure in the present disclosure, the positive feedback unit is disposed between the input terminal and the output terminal of the second pre-amplifier stage. The voltage gain of the second pre-amplifier stage is increased by using the positive feedback unit, especially a small-signal voltage gain is increased, so that equivalent input noise of the comparator can be effectively reduced.

The foregoing embodiments merely illustrate principles and effects of the present disclosure, but are not intended to limit the present disclosure. Any person skilled in the art may modify or alter the foregoing embodiments without departing from the scope of the present disclosure. Therefore, all equivalent modifications or alterations completed by a person of ordinary skill in the art without departing from the technical ideas disclosed in the present disclosure shall still be covered by the claims of the present disclosure.

What is claimed is:

1. A comparator based on a pre-amplifier stage structure, comprising at least:

a first pre-amplifier stage, wherein an input terminal of the first pre-amplifier stage is connected to a differential input signal, to amplify and output the differential input signal so as to output a first differential output signal;

a second pre-amplifier stage, wherein an input terminal of the second pre-amplifier stage is connected to the first differential output signal, to amplify and output the first differential output signal so as to output a second differential output signal, and a positive feedback unit is disposed between an output terminal of the second pre-amplifier stage and the input terminal of the second pre-amplifier stage, to increase a voltage gain of the second pre-amplifier stage by using the positive feedback unit; and a latch, wherein an input terminal of the latch is connected to the second differential output signal.

2. The comparator based on the pre-amplifier stage structure according to claim 1, further comprising another pre-amplifier stage, wherein the another pre-amplifier stage is connected in series between the first pre-amplifier stage and the second pre-amplifier stage, and a structure of the another pre-amplifier stage is the same as a structure of the second pre-amplifier stage, or, a structure of the another pre-amplifier stage is the same as a structure of the first pre-amplifier stage.

3. The comparator based on the pre-amplifier stage structure according to claim 1, further comprising N pre-amplifier stages, wherein N is an integer greater than or equal to 2, and the N pre-amplifier stages are cascaded and then connected in series between the first pre-amplifier stage and the second pre-amplifier stage, and a structure of each of the N pre-amplifier stages is the same as a structure of the second pre-amplifier stage, or, a structure of each of the N pre-amplifier stages is the same as a structure of the first pre-amplifier stage.

4. The comparator based on the pre-amplifier stage structure according to claim 1, wherein the first pre-amplifier stage comprises:

a first NMOS transistor, a second NMOS transistor, a third NMOS transistor, a first PMOS transistor, and a second PMOS transistor, wherein a source of the first NMOS transistor is grounded, a gate of the first NMOS transistor is connected to a first control signal, and a drain of the first NMOS transistor is connected to a first node;

a source of the second NMOS transistor is connected to the first node, a gate of the second NMOS transistor is connected to the differential input signal, and a drain of the second NMOS transistor is connected to a second node;

a source of the third NMOS transistor is connected to the first node, a gate of the third NMOS transistor is connected to the differential input signal, and a drain of the third NMOS transistor is connected to a third node;

a drain of the first PMOS transistor is connected to the second node, a gate of the first PMOS transistor is connected to the first control signal, and a source of the first PMOS transistor is connected to a working voltage;

a drain of the second PMOS transistor is connected to the third node, a gate of the second PMOS transistor is connected to the first control signal, and a source of the second PMOS transistor is connected to the working voltage; and the first differential output signal is output by using the second node and the third node.

5. The comparator based on the pre-amplifier stage structure according to claim 4, wherein the second pre-amplifier stage comprises a pre-amplifier stage main unit and the positive feedback unit, and the positive feedback unit comprises:

a fourth NMOS transistor, a fifth NMOS transistor, a sixth NMOS transistor, and a seventh NMOS transistor, wherein a gate of the fourth NMOS transistor is connected to a fourth node, a source of the fourth NMOS transistor is connected to a fifth node, and a drain of the fourth NMOS transistor is connected to a gate of the seventh NMOS transistor;

a source of the fifth NMOS transistor is connected to the fifth node, a gate of the fifth NMOS transistor is connected to a sixth node, and a drain of the fifth NMOS transistor is connected to a gate of the sixth NMOS transistor;

a source of the sixth NMOS transistor is connected to the sixth node, and a drain of the sixth NMOS transistor is connected to a seventh node; and a source of the seventh NMOS transistor is connected to the fourth node, and a drain of the seventh NMOS transistor is connected to an eighth node.

6. The comparator based on the pre-amplifier stage structure according to claim 5, wherein the pre-amplifier stage main unit comprises:

an eighth NMOS transistor, a third PMOS transistor, a fourth PMOS transistor, a fifth PMOS transistor, and a sixth PMOS transistor, wherein a source of the eighth NMOS transistor is grounded, and a drain of the eighth NMOS transistor is connected to the fifth node;

a second control signal is separately connected to a gate of the eighth NMOS transistor, a gate of the third PMOS transistor, a gate of the fourth PMOS transistor, a gate of the fifth PMOS transistor, and a gate of the sixth PMOS transistor, and a working voltage is separately connected to a source of the third PMOS transistor, a source of the fourth PMOS transistor, a source of the fifth PMOS transistor, and a source of the sixth PMOS transistor;

a drain of the third PMOS transistor is connected to the eighth node, a drain of the fourth PMOS transistor is connected to the seventh node, a drain of the fifth PMOS transistor is connected to the drain of the fourth NMOS transistor, and a drain of the sixth PMOS transistor is connected to the drain of the fifth NMOS transistor; and the first differential output signal is separately connected to the fourth node and the sixth node, and the second differential output signal is output by using the seventh node and the eighth node.

7. The comparator based on the pre-amplifier stage structure according to claim 6, wherein the latch comprises a sampling unit and a holding unit;

an input terminal of the sampling unit is separately connected to the seventh node and the eighth node, and the sampling unit samples the second differential output signal; and an output terminal of the sampling unit is connected to the holding unit, and the holding unit holds the second differential output signal.

8. The comparator based on the pre-amplifier stage structure according to claim 6, wherein the first control signal and the second control signal are a same control signal.

9. An analog-to-digital converter, wherein the analog-to-digital converter comprises a comparator based on a pre-amplifier stage structure the comparator based on a pre-amplifier stage structure, comprising at least:

a first pre-amplifier stage, wherein an input terminal of the first pre-amplifier stage is connected to a differential input signal, to amplify and output the differential input signal so as to output a first differential output signal;

a second pre-amplifier stage, wherein an input terminal of the second pre-amplifier stage is connected to the first differential output signal, to amplify and output the first differential output signal so as to output a second differential output signal, and a positive feedback unit is disposed between an output terminal of the second pre-amplifier stage and the input terminal of the second pre-amplifier stage, to increase a voltage gain of the second pre-amplifier stage by using the positive feedback unit; and a latch, wherein an input terminal of the latch is connected to the second differential output signal.

\* \* \* \* \*